United States Patent
Hara

(10) Patent No.: US 6,914,663 B2
(45) Date of Patent: Jul. 5, 2005

(54) EXPOSURE APPARATUS

(75) Inventor: Hiromichi Hara, Tochigi (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 10/661,972

(22) Filed: Sep. 15, 2003

(65) Prior Publication Data

US 2004/0057032 A1 Mar. 25, 2004

(30) Foreign Application Priority Data

Sep. 18, 2002 (JP) .................................. 2002-272179

(51) Int. Cl.[7] .......................... G03B 27/42; G03B 27/52
(52) U.S. Cl. .......................................... 355/30; 355/53
(58) Field of Search ........................ 355/30, 53, 72–76

(56) References Cited

U.S. PATENT DOCUMENTS

| | | | |
|---|---|---|---|
| 5,559,584 A | 9/1996 | Miyaji et al. | 355/73 |
| 5,881,987 A | 3/1999 | Hara | 248/550 |
| 6,341,006 B1 | 1/2002 | Murayama et al. | 355/53 |
| 6,493,062 B2 | 12/2002 | Tokuda et al. | 355/53 |
| 6,493,065 B2 | 12/2002 | Ina et al. | 355/53 |
| 6,614,508 B2 * | 9/2003 | Phillips et al. | 355/72 |
| 6,621,556 B2 * | 9/2003 | Iwasaki et al. | 355/53 |
| 6,727,981 B2 * | 4/2004 | Taniuchi et al. | 355/55 |
| 6,757,048 B2 * | 6/2004 | Arakawa | 355/30 |
| 2003/0048428 A1 * | 3/2003 | Kemper et al. | 355/53 |

FOREIGN PATENT DOCUMENTS

| | | |
|---|---|---|
| EP | 1 069 448 A1 | 1/2001 |
| JP | 6-260385 | 9/1994 |
| JP | 8-279458 | 10/1996 |
| JP | 2001-27727 | 1/2001 |

OTHER PUBLICATIONS

Okabe, Hideo. "Photochemistry of Small Molecules," A Wiley–Interscience Publications, 1978, pp. 178–179.

* cited by examiner

Primary Examiner—Rodney Fuller
(74) Attorney, Agent, or Firm—Fitzpatrick, Cella, Harper & Scinto

(57) ABSTRACT

An exposure apparatus has an optical system and transfers a pattern of a mask to a substrate via the optical system. The apparatus includes a structure, a partition wall which defines a space including an optical path of the optical system, and an elastic seal member which couples the structure and the partition wall to seal the space. The elastic seal member is arranged so that a hollow cylinder is compressed in a direction of an axis of the hollow cylinder. The hollow cylinder, in an uncompressed state, includes a member undulated in a cross section perpendicular to the axis and a shape of the uncompressed-state hollow cylinder in the cross section being substantially uniform along the axis.

13 Claims, 15 Drawing Sheets

EXPOSURE APPARATUS

FIELD OF THE INVENTION

The present invention relates to an exposure apparatus which transfers a pattern onto a substrate using an exposure beam.

BACKGROUND OF THE INVENTION

A manufacturing process for a semiconductor element such as an LSI or VLSI formed from a micropattern uses a reduction type projection exposure apparatus for transferring by reduction projection a circuit pattern drawn on a mask onto a substrate coated with a photosensitive agent. With an increase in the packaging density of semiconductor elements, demands have arisen for further micropatterning. Exposure apparatuses are coping with micropatterning along with the development of a resist process.

A means for increasing the resolving power of the exposure apparatus includes a method of changing the exposure wavelength to a shorter one, and a method of increasing the numerical aperture (NA) of the projection optical system.

As for the exposure wavelength, the 365-nm i-line has been replaced by a KrF excimer laser with an oscillation wavelength of around 248 nm. Also, an ArF excimer laser with an oscillation wavelength around 193 nm and a fluorine ($F_2$) excimer laser with an oscillation wavelength around 157 nm have been developed.

An ArF excimer laser with a wavelength around far ultraviolet rays, particularly, 193 nm, and a fluorine ($F_2$) excimer laser with an oscillation wavelength around 157 nm are known to have a plurality of oxygen ($O_2$) absorption bands around their wavelength bands.

For example, a fluorine excimer laser has been applied to an exposure apparatus because of a short wavelength of 157 nm. The 157-nm wavelength falls within a wavelength region generally called a vacuum ultraviolet region. In this wavelength region, light is greatly absorbed by oxygen molecules, and hardly passes through air. Thus, the fluorine excimer laser can only be applied in an environment in which the atmospheric pressure is decreased to almost vacuum and the oxygen concentration is fully decreased.

According to a reference "Photochemistry of Small Molecules" (Hideo Okabe, A Wiley-Interscience Publication, 1978, p. 178), the absorption coefficient of oxygen to 157-nm light is about 190 $atm^{-1}cm^{-1}$. This means that, when 157-nm light passes through gas at an oxygen concentration of 1% at one atmospheric pressure, the transmittance per cm is only $$T=\exp(-190 \times 1 \text{ cm} \times 0.01 \text{ atm})=0.150$$

Oxygen absorbs light to generate ozone ($O_3$), and ozone promotes absorption of light, greatly decreasing the transmittance. In addition, various products generated by ozone are deposited on the surface of an optical element, decreasing the efficiency of the optical system.

To prevent this, the oxygen concentration in the optical path is suppressed to a low level of several ppm order, or less, by a purge mechanism using inert gas, such as nitrogen in the optical path of the exposure optical system of a projection exposure apparatus using a far ultraviolet laser, such as an ArF excimer laser or a fluorine ($F_2$) excimer laser, as a light source.

In such an exposure apparatus using an ArF excimer laser beam with a wavelength around far ultraviolet rays, particularly, 193 nm, or a fluorine ($F_2$) excimer laser beam with a wavelength around 157 nm, an ArF excimer laser beam or fluorine ($F_2$) excimer laser beam is readily absorbed by a substance. The optical path must be purged to several ppm order or less. This also applies to moisture, which must be removed to the ppm order or less.

To ensure the transmittance or stability of ultraviolet rays, the ultraviolet path of the reticle stage or the like of an exposure apparatus or the like is purged with inert gas. For example, Japanese Patent Laid-Open No. 6-260385 discloses a method of spraying inert gas toward a photosensitive substrate. However, oxygen and moisture cannot be satisfactorily purged. Japanese Patent Laid-Open No. 8-279458 discloses a method of covering the whole space near a photosensitive substrate with a sealing member from the lower end of a projection optical system. However, this method is not practical because it is difficult to move the stage.

As described above, an exposure apparatus using ultraviolet rays, particularly, an ArF excimer laser beam or fluorine ($F_2$) excimer laser beam suffers from large absorption by oxygen and moisture at the wavelength of the ArF excimer laser beam or fluorine ($F_2$) excimer laser beam. To obtain a sufficient transmittance and stability of ultraviolet rays, the oxygen and moisture concentrations must be reduced.

From this, it is desired to develop an effective means for purging the ultraviolet path in an exposure apparatus, particularly, the vicinities of a wafer and reticle with inert gas.

However, vibration sources such as the motors and air compressors of various units installed on the floor and units to be isolated from vibrations, such as a projection optical system, an alignment system, a laser interferometer, and a stage, supported by a vibration isolating mechanism, coexist in an exposure apparatus. For this reason, if a space between the vibration sources and the units is purged with inert gas, vibrations are transmitted through a connecting member arranged between them to sustain airtightness. Consequently, the units supported by the vibrations isolating mechanism vibrate, thereby causing a reduction in exposure precision, and the like.

Assume that a bellows structural member is employed as the connecting member to sustain airtightness. In this case, the bellows structure member has flexibility in the compression direction and high rigidity in the shear and twist directions, but vibrations cannot be satisfactorily isolated.

SUMMARY OF THE INVENTION

The present invention has been made in consideration of the above-mentioned background, and has as its object to, e.g., suppress transmission of vibration between two independently supported structures through a member for connecting the structures and forming an enclosed space.

According to the present invention, there is provided an exposure apparatus which transfers a pattern onto a substrate with exposure light, characterized by comprising a partition wall which encloses a path of exposure light and isolates the path from surroundings, and a connecting member in a tubular form which connects the partition wall and a structure supported independently of the partition wall and sustains airtightness in a space enclosed with the partition wall, wherein a section of the connecting member, taken in a direction perpendicular to an axis of the connecting member, has a three-dimensional portion. Use of a connecting member with this structure suppresses transmission of vibrations between a room (closed space) comprising a partition wall and a structure supported independently of the partition wall, thereby avoiding disadvantages caused by transmission of vibrations, e.g., any decrease in exposure precision.

According to a preferred embodiment of the present invention, the section of the connecting member preferably has a plurality of three-dimensional portions.

According to a preferred embodiment of the present invention, the connecting member preferably connects the structure and the partition wall in an axially compressed state.

According to a preferred embodiment of the present invention, the connecting member is preferably made of resin, rubber (e.g., fluororubber), or the like.

According to a preferred embodiment of the present invention, the connecting member is preferably made of a material having a thickness of not more than two mm. Alternatively, the connecting member is preferably arranged to be resistant to a gage pressure of not more than one MPa.

In the present invention, the term "tubular form" includes a structure which has a polygonal (e.g., quadrangular) section with a three-dimensional portion and a structure which has a circular section with a three-dimensional portion.

According to a preferred embodiment of the present invention, preferably, the structure is supported by a vibration isolating mechanism, and the partition wall is preferably supported by a structure which can transmit vibrations to the partition wall. The partition wall can be supported by a support member which receives vibrations from a floor. The partition wall may connect to a second structure other than the structure through a second connecting member, and in this case, the second connecting member preferably has the same structure as a structure of the connecting member.

Alternatively, the structure is supported by a structure which can transmit vibrations to the structure, and the partition wall may be supported through a vibration isolating mechanism.

According to a preferred embodiment of the present invention, a substrate stage or reticle stage can be arranged in the space enclosed with the partition wall.

According to the present invention, there is provided a device manufacturing method comprising a step of transferring a pattern onto a substrate using the above-mentioned exposure apparatus, and a step of developing the substrate.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENT

First, the principle of the present invention will be described.

Figure 10:
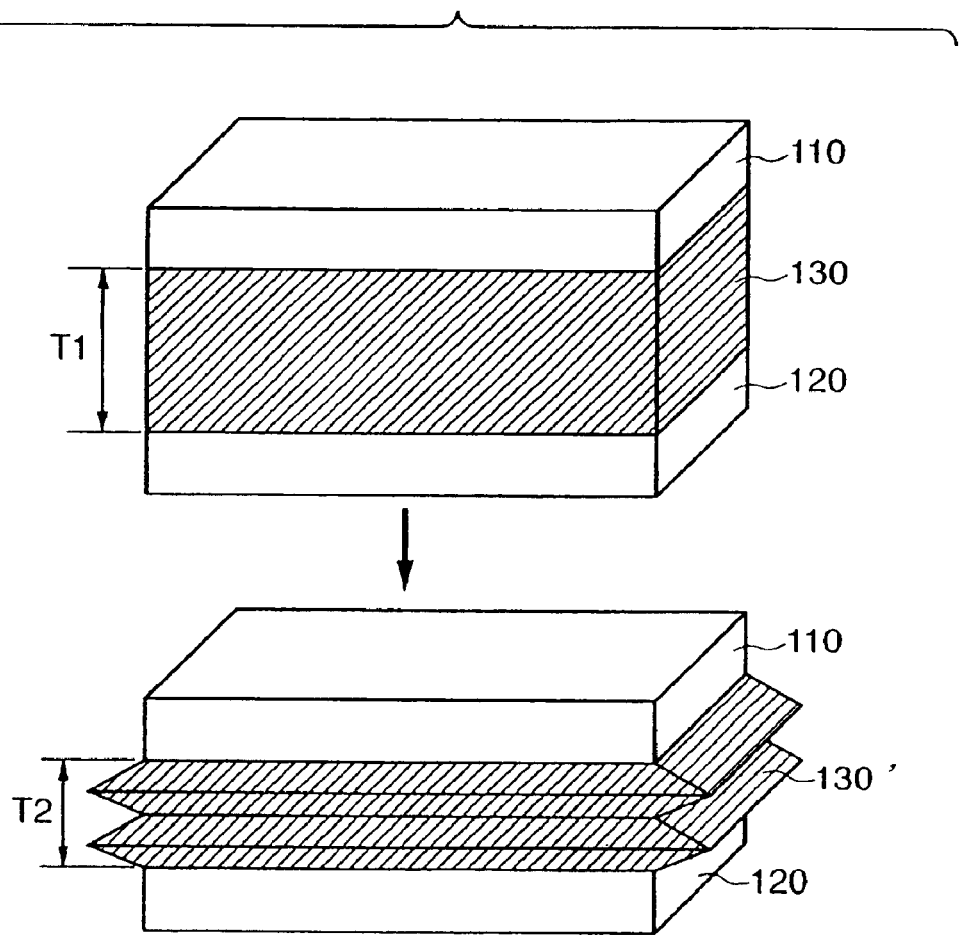
FIG. 10 is a view of a model of an airtightness sustaining mechanism with a bellows structure.

FIG. 10 is a view of a model of a conventional airtightness sustaining mechanism with a bellows structure. The modeled structure has a hollow connecting member 130 between a first portion (flange) 110 and a second portion (flange) 120. A distance between the first portion 110 and the second portion 120 in an uncompressed state is represented by T1. If the structure is vertically compressed such that the distance T1 reduces to a distance T2, the connecting member 130 transforms into a bellows structure portion 130'.

Figure 11:
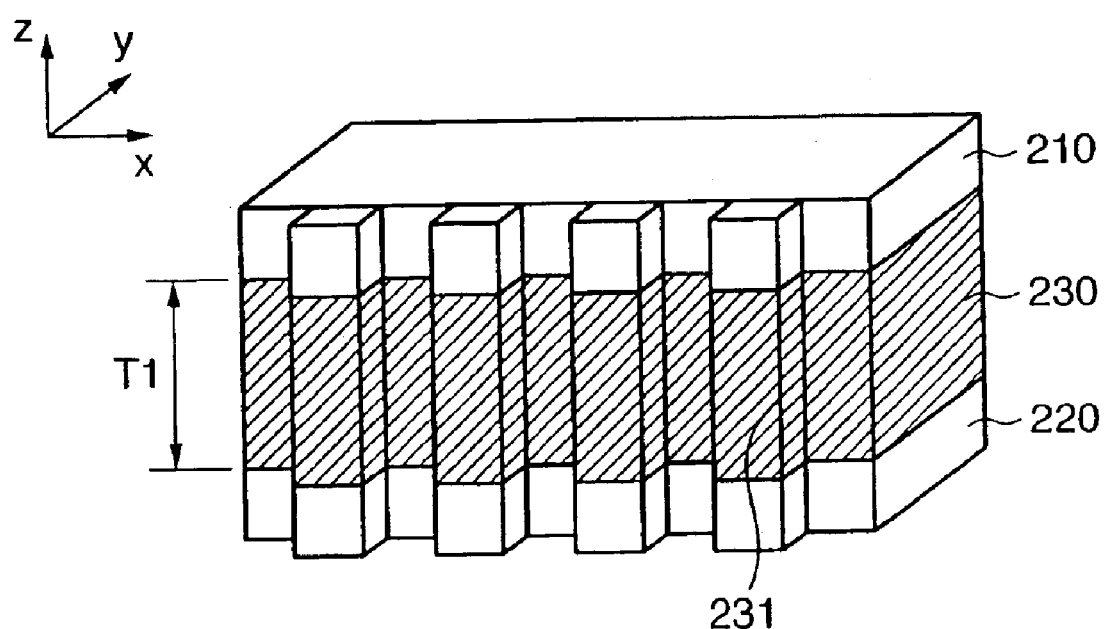
FIG. 11 is a view of a model of an airtightness sustaining mechanism according to the present invention.

FIG. 11 is a view of a model of an airtightness sustaining mechanism according to the present invention. The modeled structure has a tubular or hollow connecting member 230 between a first portion (flange) 210 and a second portion (flange) 220. In this structure, the connecting member 230 has a three-dimensional portion 231 comprised of axially (in the Z direction in FIG. 11) extending projections and recesses. Use of the structure so compressed as to reduce a thickness T1 of the connecting member can provide an airtightness sustaining mechanism with high flexibility in the shear direction (X direction in FIG. 11).

It will be described with reference to FIGS. 12 and 13 that the airtightness sustaining mechanism of the present invention is better in flexibility in the shear direction than the conventional airtightness sustaining mechanism.

Figure 12:
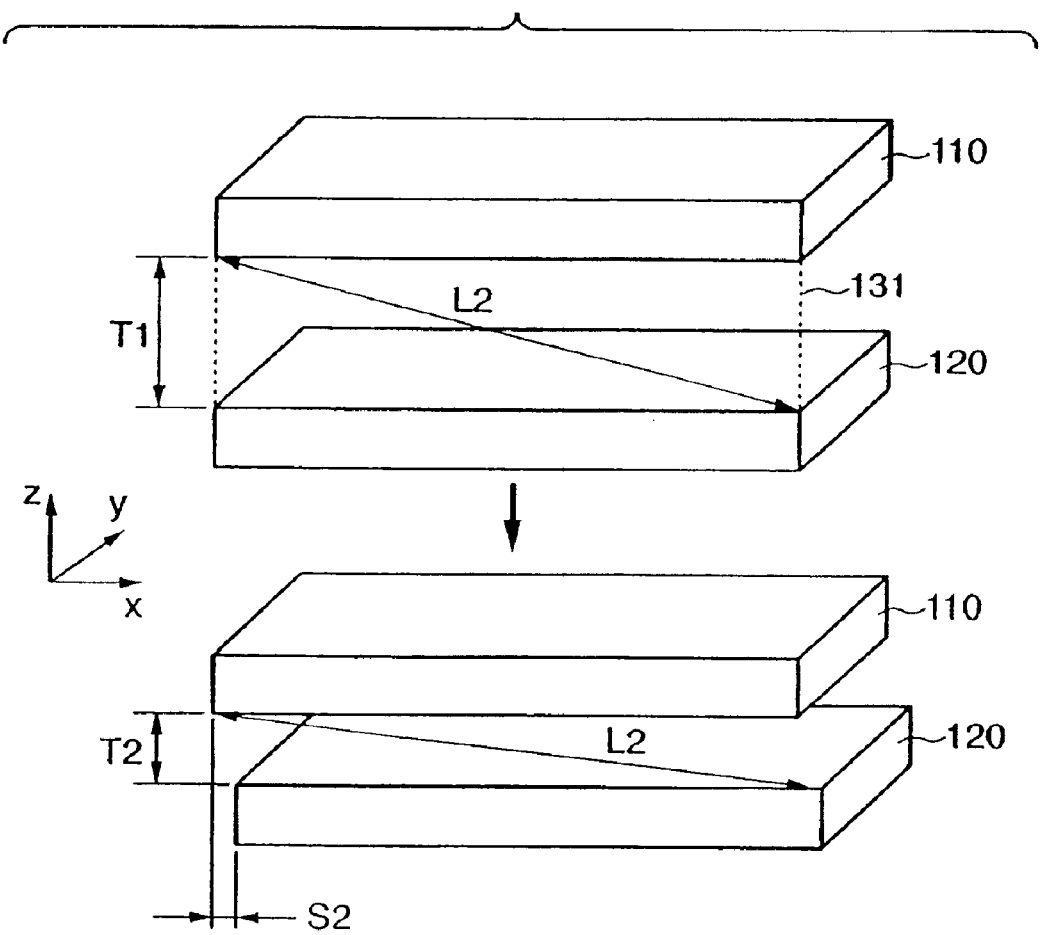
FIG. 12 is a view showing the flexibility of the airtightness sustaining mechanism with the bellows structure.

FIG. 12 shows the first portion (flange) 110 and second portion (flange) 120 of the conventional airtightness sustaining mechanism with the bellows structure. Assume that a length L2, in the diagonal direction, of a surface 131 of a connecting member (not shown) interposed between the first portion 110 and the second portion 120 does not change. If a distance between the first portion 110 and the second portion 120 reduces from T1 to T2, the first portion 110 and the second portion 120 have a relative shift S2 in the shear direction (X direction in FIG. 13).

Figure 13:
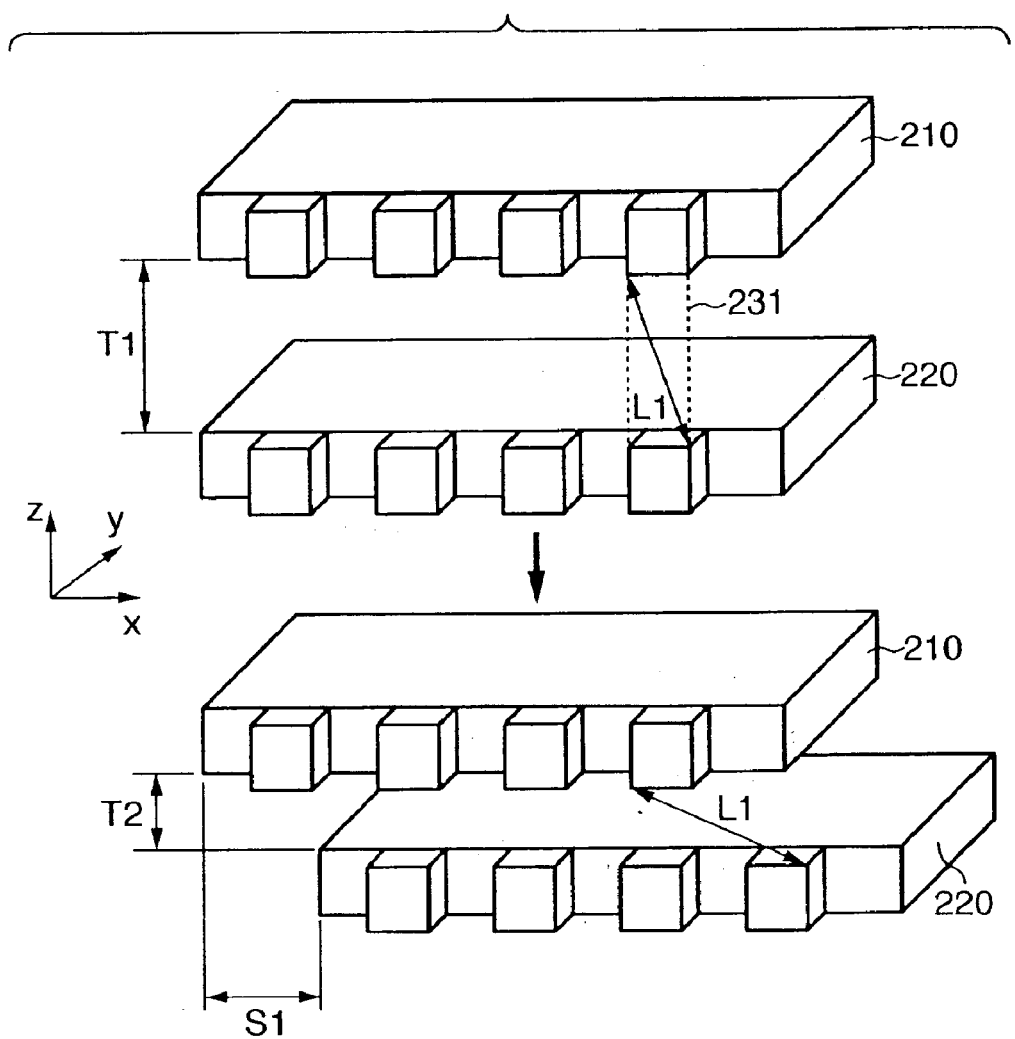
FIG. 13 is a view showing the flexibility of the airtightness sustaining mechanism according to the present invention.

FIG. 13 shows the first portion (flange) 210 and second portion (flange) 220 of the airtightness sustaining mechanism of the present invention. Assume that a length L1, in the diagonal direction, of the surface 231 of a connecting member (not shown) interposed between the first portion 210 and the second portion 220 does not change. If a distance between the first portion 210 and the second portion 220 reduces from T1 to T2, the first portion 210 and the second portion 220 have a relative shift S1 in the shear direction (X direction in FIG. 13).

As can be seen from FIGS. 12 and 13, the shift amount S1, in the shear direction, of the airtightness sustaining mechanism of the present invention is larger than the shift amount S2, in the shear direction, of the conventional airtightness sustaining mechanism. That is, the airtightness sustaining mechanism of the present invention is more flexible than the conventional airtightness sustaining mechanism and can increase a shift amount between the first member and the second member.

The airtightness sustaining mechanism of the present invention can be applied to various apparatuses including an exposure apparatus. The airtightness sustaining mechanism of the present invention is particularly suitable for an exposure apparatus using far ultraviolet rays such as an ArF excimer laser with a wavelength around 193 nm and a fluorine ($F_2$) excimer laser with a wavelength around 157 nm.

Figure 1:
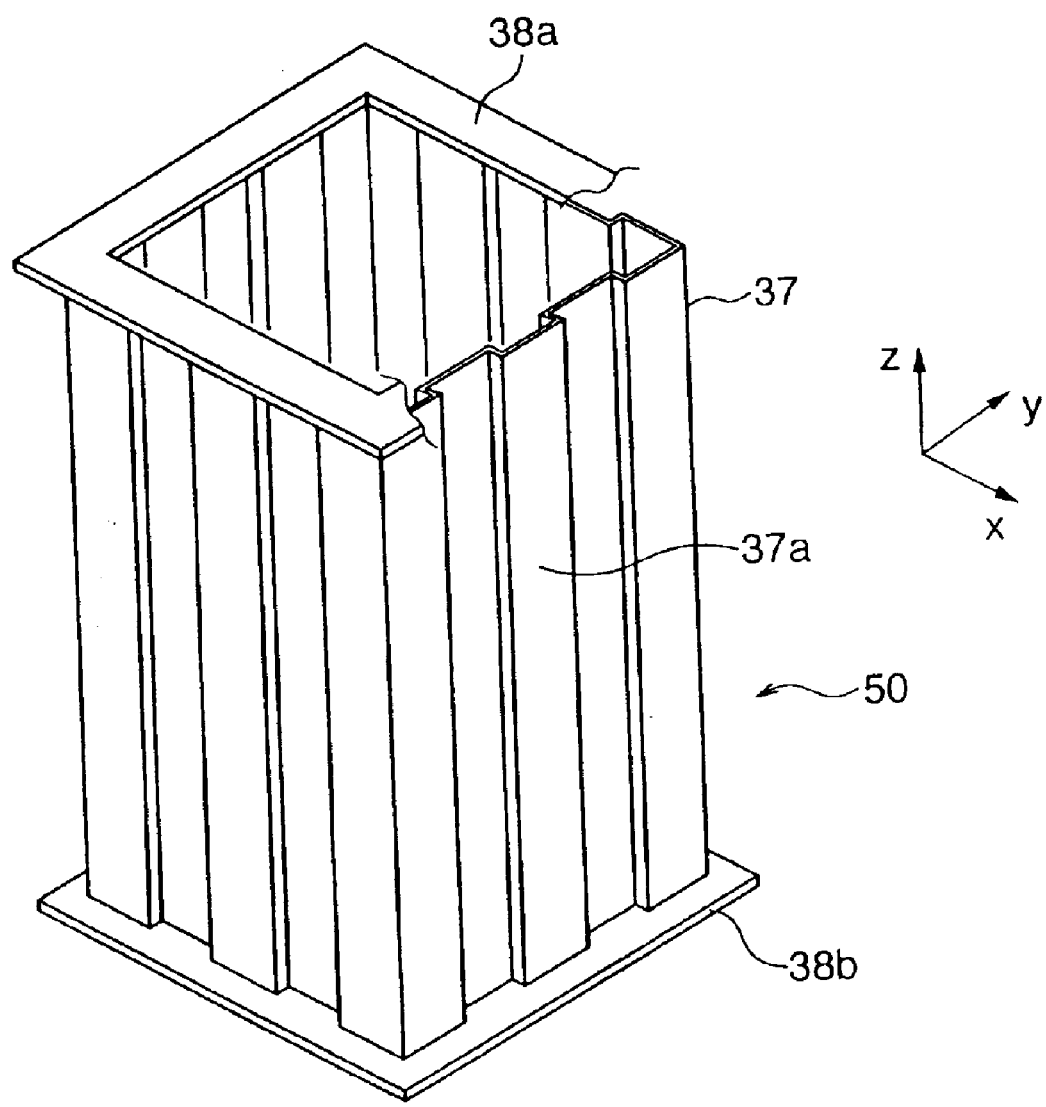
FIG. 1 is a perspective view showing the structure of an airtightness sustaining mechanism according to a preferred embodiment of the present invention.

An airtightness sustaining mechanism according to a preferred embodiment of the present invention will be described next. FIG. 1 is a perspective view showing the structure of the airtightness sustaining mechanism according to the preferred embodiment of the present invention. The airtightness sustaining mechanism is suitable for an exposure apparatus for manufacturing devices such as a semiconductor device.

An airtightness sustaining mechanism 50 according to the preferred embodiment of the present invention causes the first structure and the second structure to communicate with each other and isolates them from the external space (i.e., sustains airtightness), thereby forming an enclosed space. At least one of the first and second structures comprises a structure which forms a space.

The airtightness sustaining mechanism 50 comprises a first flange 38a to be connected to the first structure, a second flange 38b to be connected to the second structure, and a tubular or hollow connecting member 37, which connects the first flange 38a and second flange 38b. A "tubular" structure may be any structure with a closed-figure section, such as a polygonal section, as well as a circular section.

The airtightness sustaining mechanism 50 is typically interposed between the first structure and the second structure in an axially compressed state.

Figure 6:
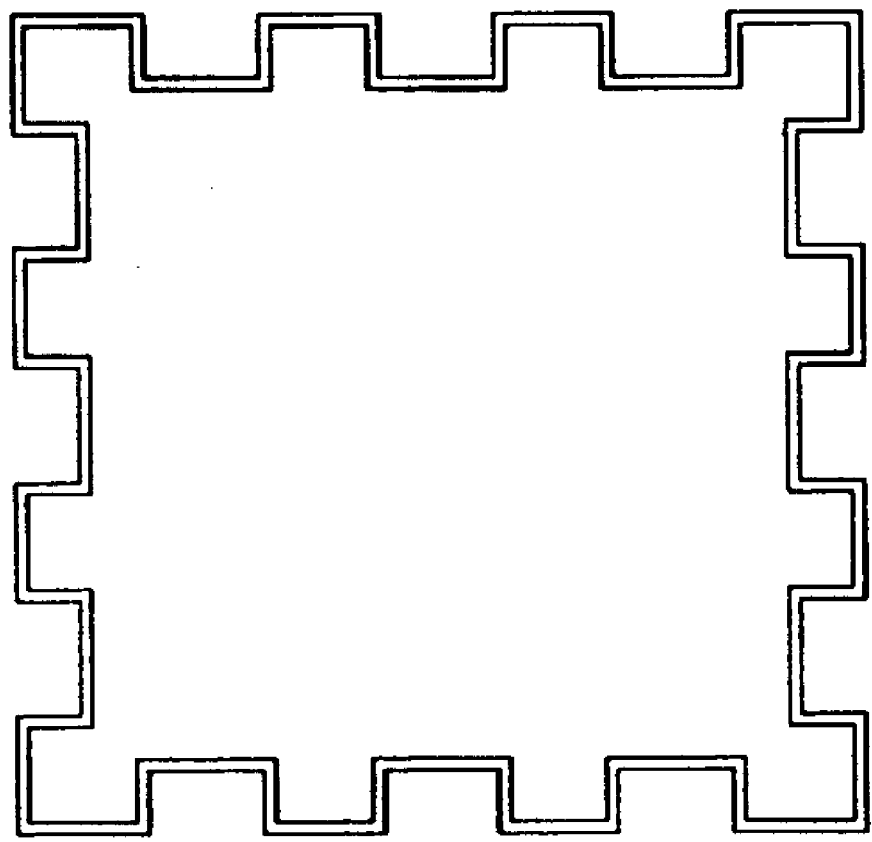
FIG. 6 is a sectional view of a connecting member of the airtightness sustaining mechanism, taken in a direction perpendicular to the axial direction.

The connecting member 37 has one or more three-dimensional portions 37a in a section taken in a direction (along a plane parallel to the X-Y plane in FIG. 1) perpendicular to the axial direction (Z direction in FIG. 1), i.e., a direction in which the first and second flanges 38a and 38b face each other, as shown in FIG. 6. The three-dimensional portion 37a comprises a projection and a recess which axially extend. The three-dimensional portion 37a is preferably provided on each side of the connecting member 37. More preferably, each side of the connecting member has a plurality of three-dimensional portions 37a.

By providing one or more three-dimensional portions 37a in the connecting member 37, the airtightness sustaining mechanism 50 can increase the flexibility in the shear (X and Y directions in FIG. 1), compression (Z direction in FIG. 1), and rotation (directions about the X-, Y- and Z-axes, particularly, the direction about the Z-axis) directions. With this structure, even if the connecting member 37 is made of a material with small elasticity, such as a rubber sheet combined with a fabric, the airtightness sustaining mechanism 50 can obtain high flexibility in all of the compression, shear, and rotation directions.

The connecting member 37 is preferably made of resin, rubber (e.g., fluororubber), or the like. A wall member constituting the connecting member 37 preferably has a thickness of two mm or less. The connecting member 37 is preferably arranged to be resistant to a gage pressure of one MPa or less. The above-mentioned arrangement contributes to an increase in flexibility of the connecting member 37.

Figure 2:
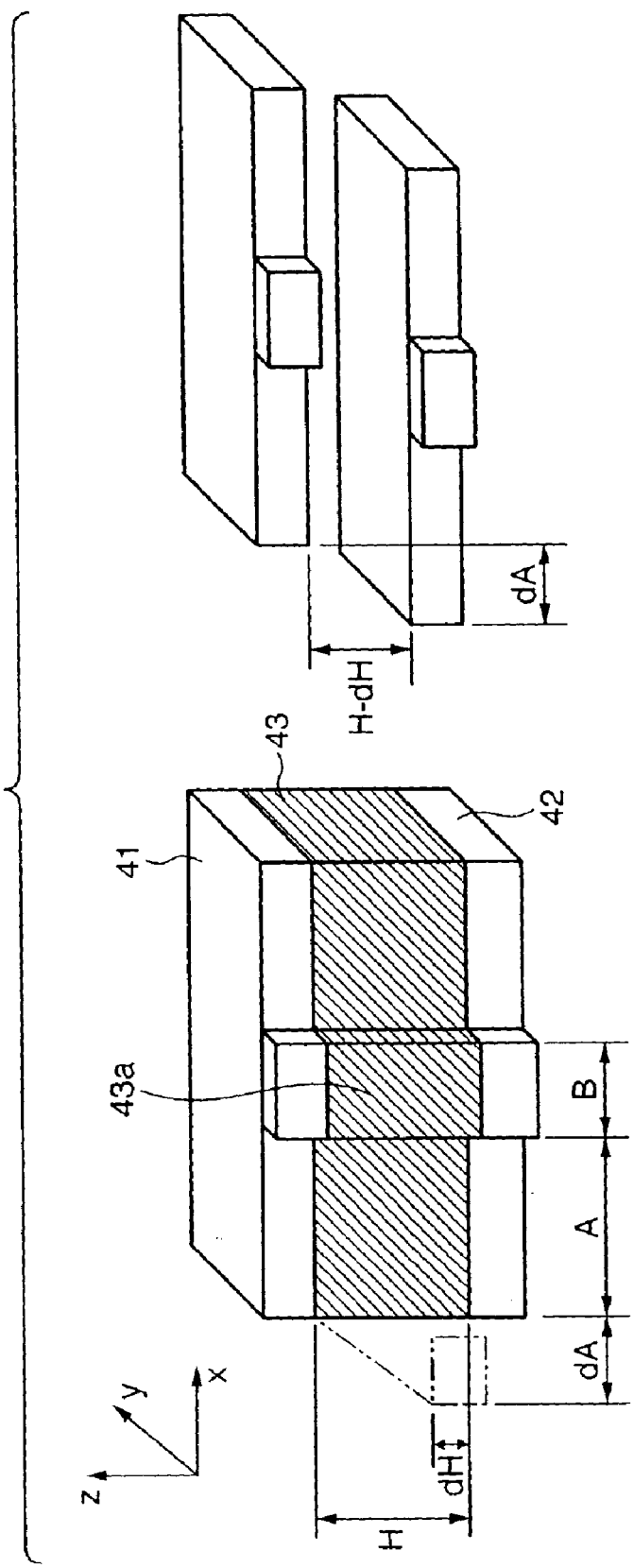
FIG. 2 is a view of a model of an airtightness sustaining mechanism shown in FIG. 1.

As an example, the flexibility in the shear direction will be described below. For the sake of descriptive simplicity, FIG. 2 shows a model of the airtightness sustaining mechanism shown in FIG. 1. A first member (flange) 41, a second member (flange) 42, and a connecting member 43 in FIG. 2 correspond to the first flange 38a, second flange 38b, and connecting member 37 in FIG. 1, respectively. The model of FIG. 2 has a three-dimensional portion including a projection 43a on a side of the connecting member 37. Although FIG. 2 shows only one projection 43a, a plurality of projections 43a may be provided at intervals A.

A maximum shift amount dA which indicates the flexibility, in the shear direction, of the airtightness sustaining mechanism shown in FIG. 2 can be represented by equation (1):

$$dA = (A^2 + 2dH \cdot H - dH^2)^{1/2} - A \qquad (1)$$

where A is a distance between the projections 43a of the connecting member 43 (distance between steps), H is a length, in the axial direction (Z direction), of the connecting member 43, and dH is a compression amount in the axial direction.

Figure 3:
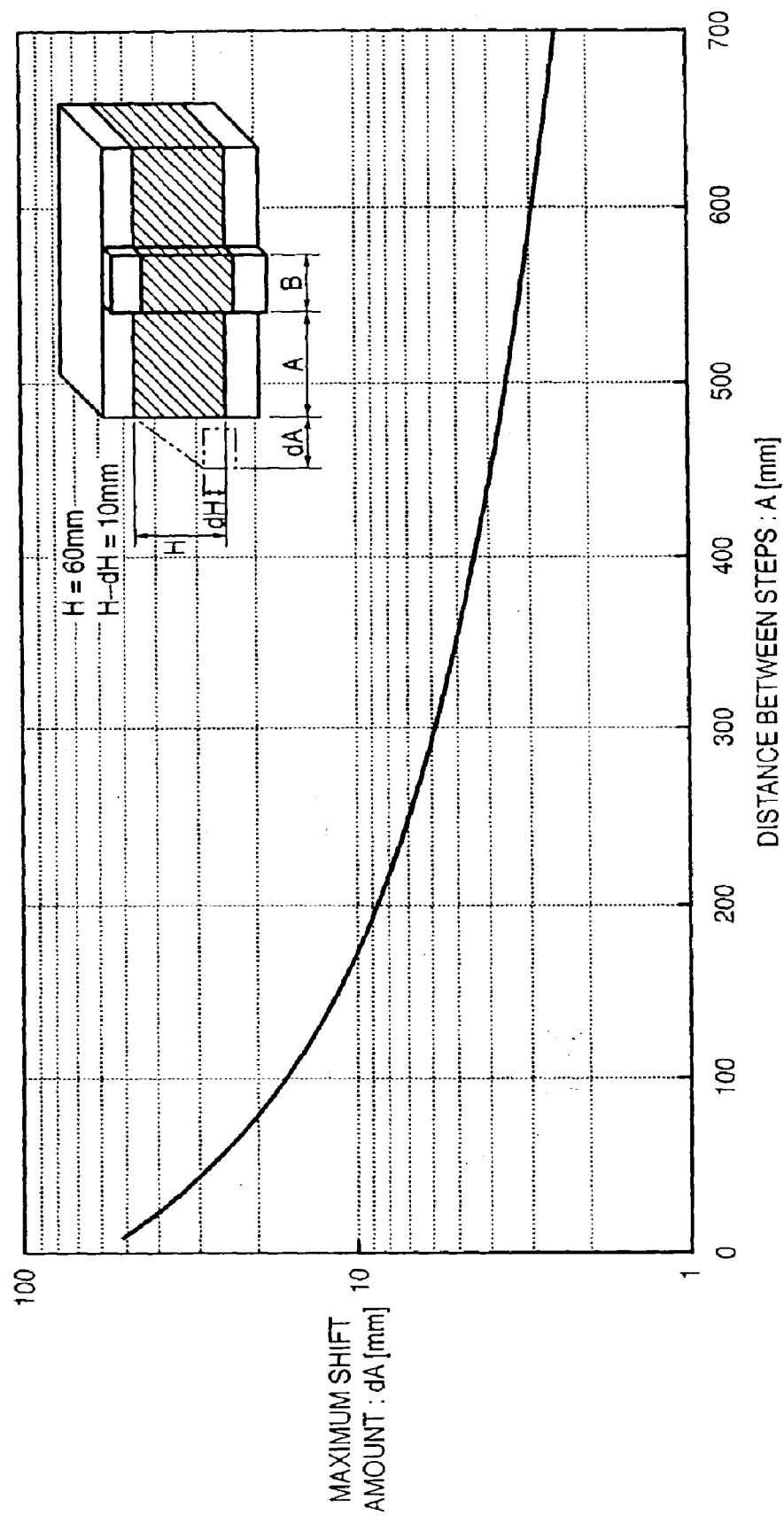
FIG. 3 is a graph showing the flexibility of the model shown in FIG. 2, which depends on the shape of a three-dimensional portion.

FIG. 3 shows the maximum shift amount dA when the length H=60 mm and the compression amount dH=50 mm are substituted into equation (1). The maximum shift amount dA depends on the distance A.

As shown in FIG. 3, by increasing the number of three-dimensional portions and decreasing the distance A between the projections 43a, the maximum shift amount can be increased, thereby obtaining a structure with high flexibility.

Figure 4:
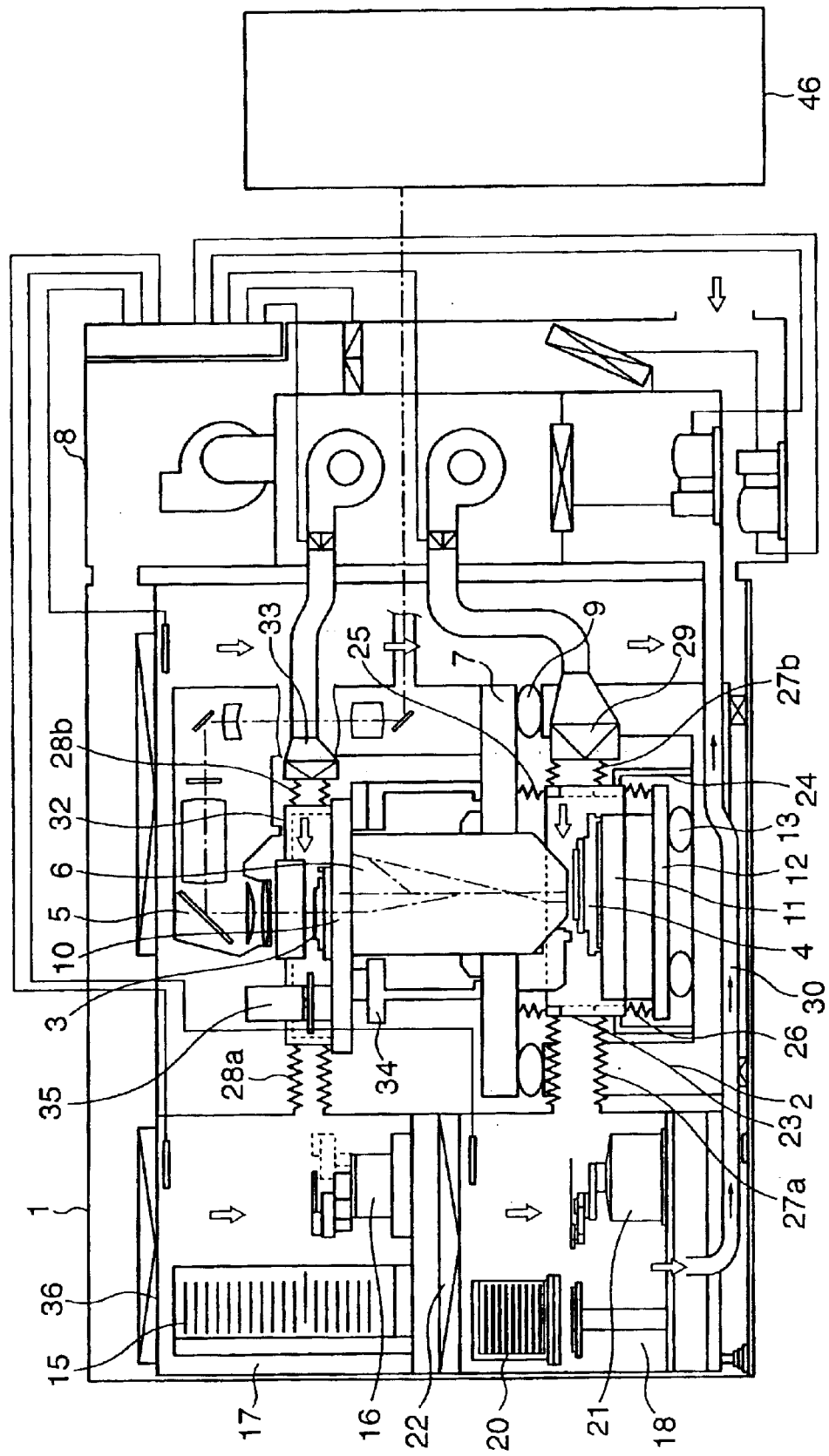
FIG. 4 is a view showing the schematic arrangement of an exposure apparatus according to the preferred embodiment of the present invention.

FIG. 4 is a schematic view showing an example of an exposure apparatus having the airtightness sustaining mechanism shown in FIG. 1. The exposure apparatus main body is stored in a chamber 1, and the ambient temperature of the exposure apparatus main body is so controlled as to have a precision of, e.g., about ±0.03° C.

The exposure apparatus shown in FIG. 4 comprises a base frame 2 serving as the base of the exposure apparatus main body, a reticle stage 3 which can move while holding a reticle (master), a wafer stage 4 which can move while holding a wafer (substrate), an illumination optical system 5 which illuminates a reticle with illumination light, a projection optical system 6 which reduces and projects a reticle pattern onto a wafer at a predetermined magnification (e.g., 4:1), a lens barrel surface plate 7 which holds the projection optical system 6, and an air-conditioned equipment room 8 which supplies temperature-controlled clean air.

The projection optical system 6 is a single barrel type catadioptric system, similar to a projection optical system disclosed in Japanese Patent Laid-Open No. 2001-27727. The projection optical system 6 has a closed structure, and its interior is purged with temperature/humidity-controlled inert gas such as nitrogen or helium.

The illumination optical system 5 introduces illumination light through a beam line extending from a light source device 46 which is set on the floor separately from the exposure apparatus or an internal light source device. The illumination optical system 5 generates slit light from the introduced illumination light through various lenses and stops, and slit-illuminates a reticle held by the reticle stage 3 from above the reticle. Examples of illumination light are an excimer laser beam (e.g., KrF, ArF, or $F_2$), harmonic (e.g., YAG laser beam or metal vapor laser beam), and ultraviolet rays (e.g., i-line). The illumination optical system 5 has a closed or almost closed structure, and its interior is purged with temperature/humidity-controlled inert gas such as nitrogen or helium.

The base frame 2 is set on the installation floor of the clean room of a semiconductor manufacturing factory. The base frame 2 is fixed to the floor at high rigidity, and can be regarded to be substantially integrated with the floor or extend from the floor. The base frame 2 includes three or four high-rigidity columns, and vertically supports the lens barrel surface plate 7 through active dampers (vibration isolating mechanisms) 9 at the tops of the columns. The active damper 9 incorporates an air spring, a damper, and an actuator. The active damper 9 prevents transmission of high-frequency vibrations from the floor to the lens barrel surface plate 7, and actively compensates for the tilt or swing of the lens barrel surface plate 7.

The lens barrel surface plate 7 which holds the projection optical system 6 also supports a reticle stage surface plate 10 through a reticle holding frame 34. The lens barrel surface plate 7 is equipped with an alignment detector for detecting the alignment states of a reticle and wafer. Alignment is performed using the lens barrel surface plate 7 as a reference.

A wafer is set on the wafer stage 4. The position of the wafer stage 4 is measured by an interferometer (not shown), and the wafer stage 4 can be driven in an optical axis direction (Z direction) of the projection optical system 6, X and Y directions perpendicular to the optical axis direction, and ωx, ωy, and ωz directions around the axes.

A linear motor is adopted as an alignment driving source. The wafer stage 4 basically comprises a two-dimensional stage constituted by an X stage which moves straight in the X direction, an X linear motor, a Y stage which moves straight in the Y direction perpendicular to the X direction, and a Y linear motor. A stage capable of moving in the Z direction, tilt (ωX and ωY) directions, and rotational (ωZ) direction is mounted on the two-dimensional stage.

The wafer stage 4 is supported by a wafer stage surface plate 11, and moves on the X-Y horizontal guide surface (guide surface) of the wafer stage surface plate 11. The wafer stage surface plate 11 is supported on a stage base member 12 by three (or four) support legs.

The stage base member 12 is vertically supported by the base frame 2 at three portions through three active dampers (vibration isolating mechanisms) 13. Most of the load of the stage base member 12 and members mounted on it is basically supported by the three active dampers 13. The load received by the active dampers 13 is received by the base frame 2 which is substantially integrated with the floor. Thus, the basic load of the wafer stage 4 is substantially supported by the floor. The active damper 13 uses an air spring capable of supporting a large load.

The position of the reticle stage 3 is also measured by an interferometer (not shown), and the reticle stage 3 can be driven in the X and Y directions perpendicular to the optical axis direction (Z direction) of the projection optical system 6.

By illumination of the illumination system 5, the pattern image of a reticle is projected onto a wafer held by the wafer stage 4 through the projection optical system 6. At this time, the wafer stage 4 and reticle stage 3 are relatively moved in a direction perpendicular to the optical axis direction (Z direction) of the projection optical system 6. As a result, the pattern image is transferred in a predetermined region on the wafer. The same transfer operation is repeated by step & scan for a plurality of exposure regions on the wafer, thereby transferring the pattern on the entire surface of the wafer.

The reticle is stored in a reticle storage 15 and transferred by a reticle transfer system 16. The reticle storage 15 and reticle transfer system 16 are arranged in a space 17 within the chamber 1. The reticle is transferred by the reticle transfer system 16 to a reticle alignment unit 35. The reticle alignment unit 35 is fixed to the upper surface of the reticle holding frame 34, mounts/recovers the reticle on/from the reticle stage 3, and aligns the position of the reticle.

The wafer is stored in a wafer storage 20 and transferred by a wafer transfer system 21. The wafer storage 20 and wafer transfer system 21 are arranged in a space 18 within the chamber 1. The wafer is mounted/recovered on/from the wafer stage 4 by the wafer transfer system 21.

Figure 5:
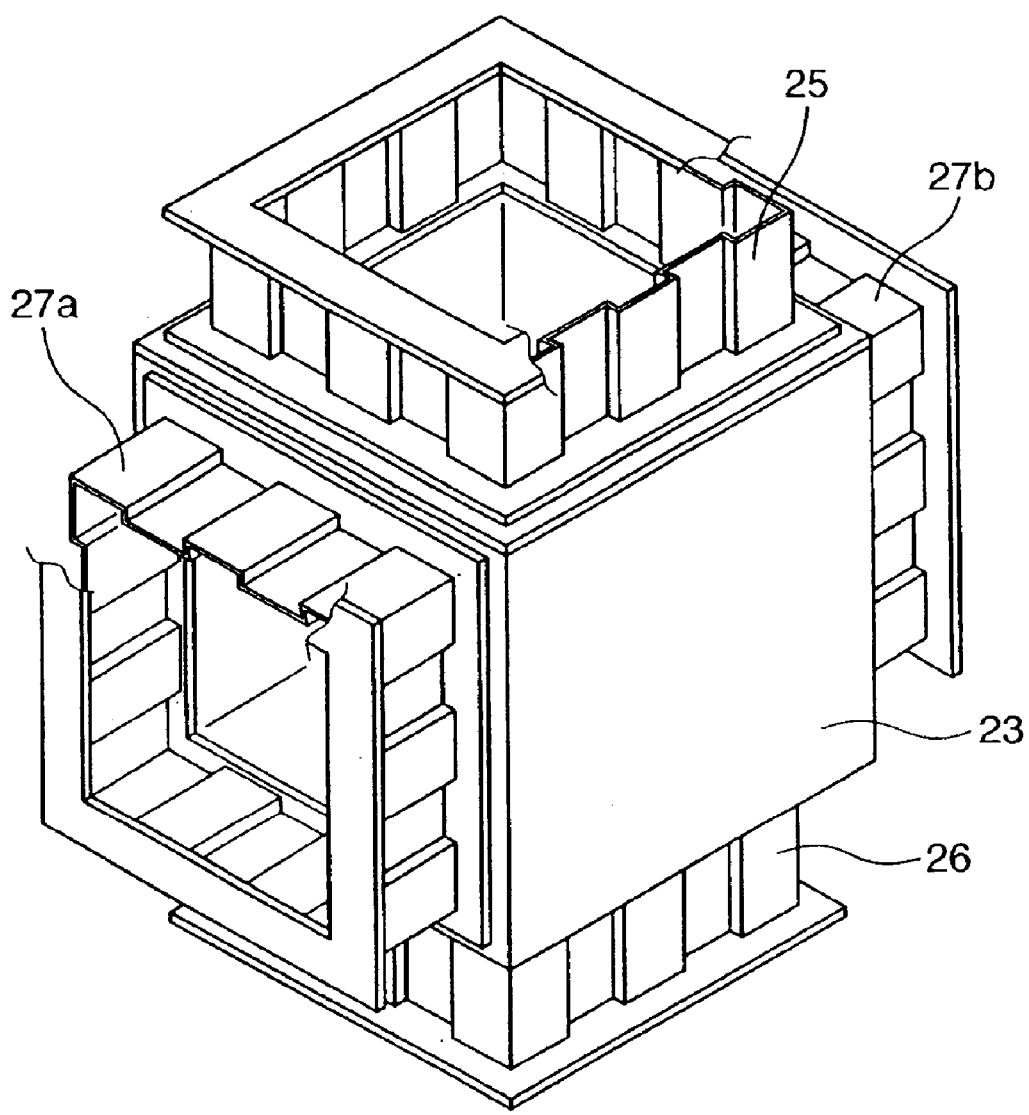
FIG. 5 is a perspective view of a partition wall (purge chamber) portion in FIG. 4.

An airtightness sustaining mechanism mounted near the wafer stage 4 of the exposure apparatus will be described next. As shown in FIG. 4, a box-like partition wall (purge chamber) 23 is interposed between the lens barrel surface plate 7 and the wafer stage 4. FIG. 5 is a perspective view of the partition wall 23 and its surroundings in FIG. 4. The partition wall 23 is supported through a support member 24 by the base frame 2. The partition wall 23 has openings in the upper and lower surfaces. The upper opening and the facing lower surface of the lens barrel surface plate (an example of a structure) 7 are connected by an airtightness sustaining mechanism 25 so as to sustain airtightness.

The lower opening of the partition wall 23 and the facing upper surface of the stage base member (an example of a structure) 12 which supports the wafer stage 4 are also connected by an airtightness sustaining mechanism 26 so as to sustain airtightness.

Each of the airtightness sustaining mechanisms 25 and 26 has a structure shown in FIG. 1 and is very flexible. The airtightness sustaining mechanisms 25 and 26 can thus keep the interior of the partition wall 23 airtight without transmitting vibrations of the box-like partition wall 23 which swings by vibrations from the exposure apparatus installation floor, to the lens barrel surface plate 7 and wafer stage 4 which are supported by the active dampers 9 and active dampers 13.

The box-like partition wall 23 also has an opening on a side on which the wafer transfer system 21 is arranged. This opening and an opening formed in a chamber (an example of the second structure) 22, which covers the wafer transfer system 21, are also connected by an airtightness sustaining mechanism 27a having the structure shown in FIG. 1 so as to sustain airtightness.

The box-like partition wall 23 also has an opening on a side of a filter 29 connected to the air-conditioned equipment room 8 through an air duct. This opening and the filter (an example of the second structure) 29 are also connected by an airtightness sustaining mechanism 27b having the structure shown in FIG. 1 so as to sustain airtightness.

Temperature-controlled inert gas such as nitrogen is supplied to a space (purge space) enclosed with the partition wall 23 near the wafer stage 4 through the filter 29. Gas supplied to the purge space passes through the space 18 and returns to the air-conditioned equipment room 8 again through a return portion 30. More specifically, a circulation system of inert gas through the active damper 9, purge space, space 18, and return portion 30 is constituted.

An airtightness sustaining mechanism mounted near the reticle stage 3 will be described next. As shown in FIG. 4, a box-like partition wall (purge chamber) 32 is arranged to cover the reticle stage 3. The partition wall 32 is supported by the reticle holding frame 34.

The box-like partition wall 32 has an opening on a side on which the reticle transfer system 16 as well as the optical path is arranged. This opening and an opening formed in a chamber 36 which airtightly covers the reticle transfer system 16 are also connected by an airtightness sustaining mechanism 28a having the structure shown in FIG. 1 so as to sustain airtightness.

The box-like partition wall 32 also has an opening on a side of a filter 33 connected to the air-conditioned equipment room 8 through an air duct. This opening and the filter 33 are also connected by an airtightness sustaining mechanism 28b having the structure shown in FIG. 1 so as to sustain airtightness.

Each of the airtightness sustaining mechanisms 28a and 28b has a structure shown in FIG. 1 and is very flexible. The airtightness sustaining mechanisms 28a and 28b can thus keep the interior of the partition wall 32 airtight without transmitting vibrations of the chamber 36 of the reticle transfer system 16 which swings by vibrations from the exposure apparatus installation floor and vibrations of the air-conditioned equipment room 8, to the lens barrel surface plate 7 and reticle stage 3 which are supported by the active dampers 9.

Temperature-controlled inert gas such as nitrogen is supplied to a space (purge space) enclosed with the partition wall 32 near the reticle stage 3 through the filter 33.

With this arrangement, the optical path that extends from the illumination optical system 5 to the projection optical system 6 through a reticle and the optical path that extends from the projection optical system 6 to a wafer are purged with inert gas such as nitrogen having high transmittance even for far ultraviolet rays such as an ArF excimer laser beam or fluorine ($F_2$) excimer laser beam. Since illumination light reaches the wafer surface at high transmittance, the exposure time can be shortened to increase the throughput of the exposure process.

The lens barrel surface plate 7 and wafer stage 4 which are supported by the active dampers 9 and active dampers 13, respectively, are connected to the purge chamber constituted by the partition wall 23 through the flexible airtightness sustaining mechanisms 25 and 26, and transmission of vibrations from the purge chamber is suppressed. In addition, the purge chamber is connected to the chamber 22 of the wafer transfer system 21 and air-conditioned equipment room 8 through the flexible airtightness sustaining mechanisms 27a and 27b, and transmission of vibrations from the chamber 22 and air-conditioned equipment room 8 to the purge chamber is suppressed.

The lens barrel surface plate 7 and reticle stage 3, which are supported by the active dampers 9, are connected to the chamber 36 of the reticle transfer system 16 and air-conditioned equipment room 8 through the flexible airtightness sustaining mechanisms 28a and 28b, and transmission of vibrations from the chamber 36 and air-conditions equipment room 8 to the purge chamber is suppressed.

Figure 7:
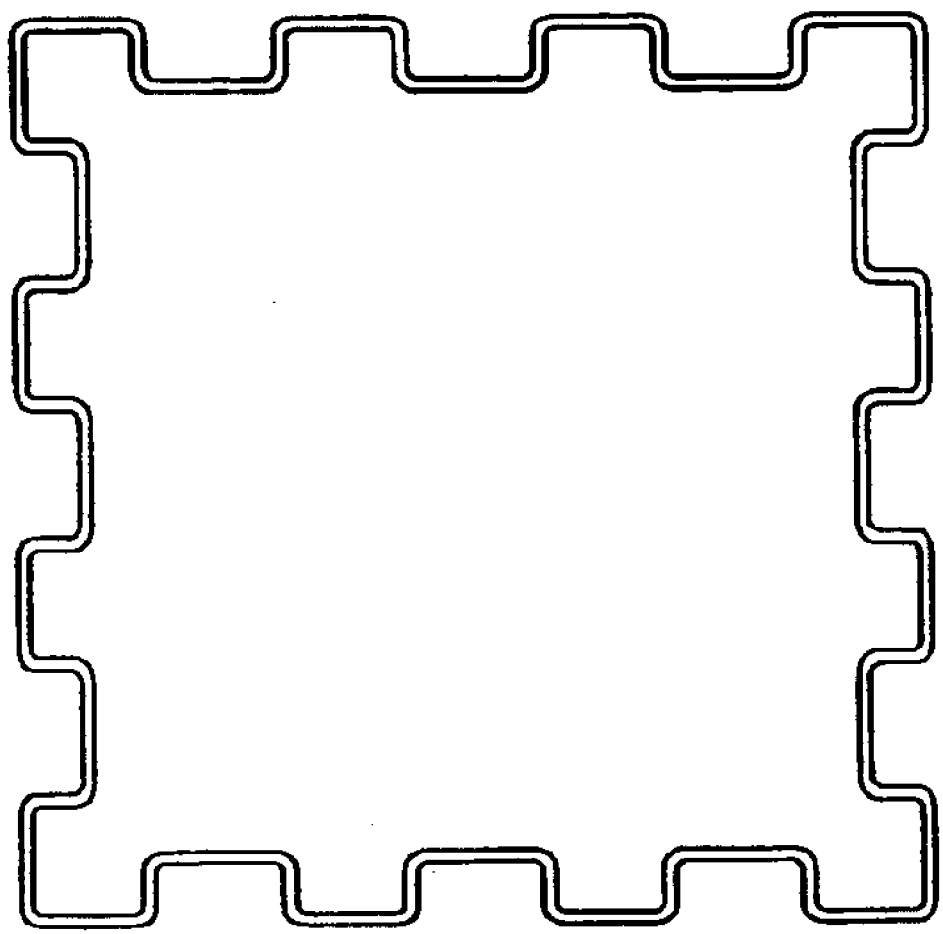
FIG. 7 is a view showing another structure of the connecting member.
Figure 8:
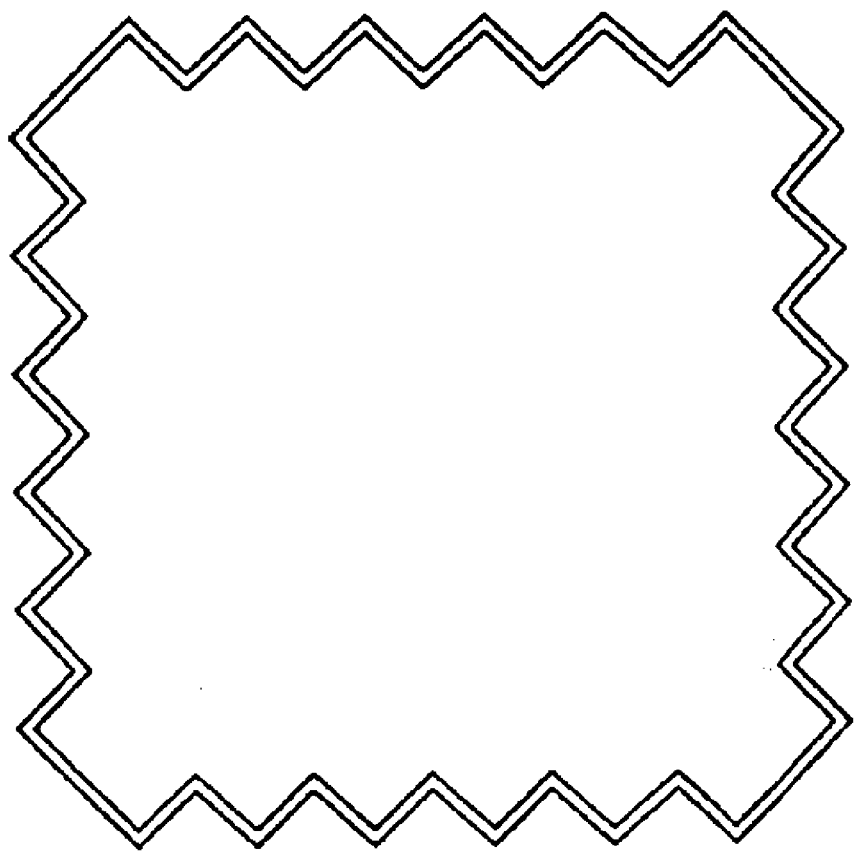
FIG. 8 is a view showing still another structure of the connecting member.
Figure 9:
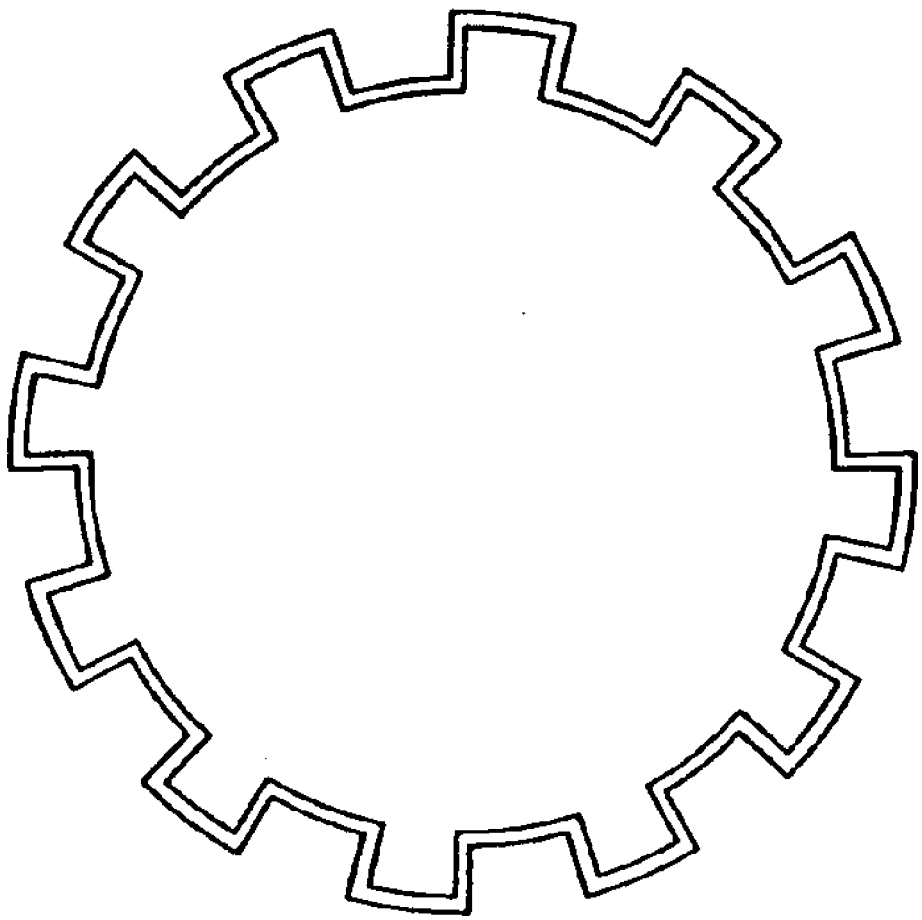
FIG. 9 is a view showing still another structure of the connecting member.

A sectional shape of the connecting member 37 shown in FIG. 1 can be changed to, eg., any one of the shapes shown in FIGS. 7 to 9. Each of FIGS. 7 and 8, and FIG. 6 described above, shows an example in which a section taken in a direction perpendicular to the axial direction has a certain polygonal shape with a three-dimensional portion, and the three-dimensional portions in FIGS. 6 to 8 have different shapes. FIG. 9 shows an example in which a section taken in a direction perpendicular to the axial direction has a circular shape with a three-dimensional portion.

Figure 14:
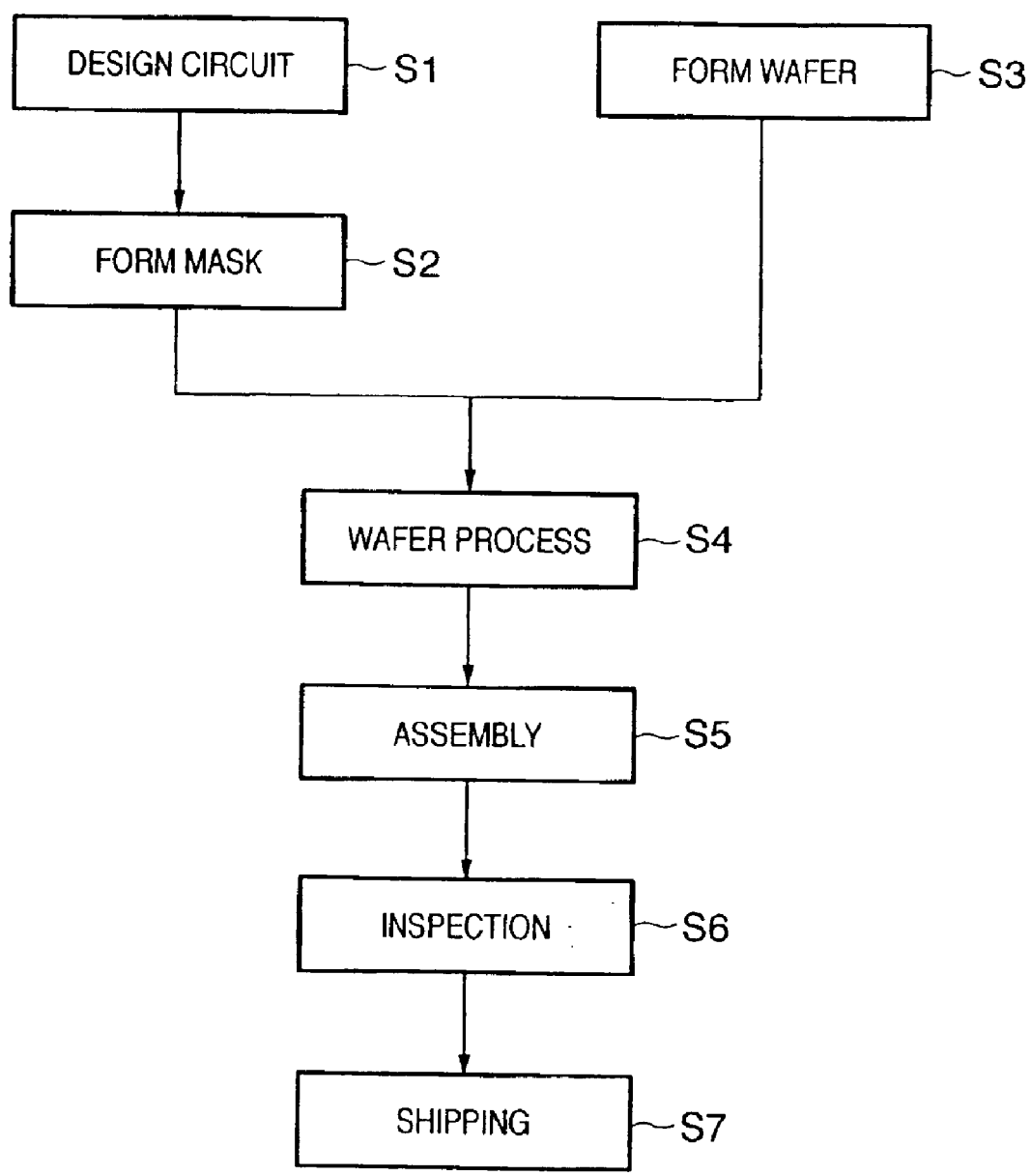
FIG. 14 is a flow chart showing the flow of the whole manufacturing process of a semiconductor device using the exposure apparatus of the present invention.

A semiconductor device manufacturing process using the above-described exposure apparatus will be explained. FIG. 14 is a flow chart showing the flow of the whole manufacturing process of a semiconductor. In step 1 (circuit design), the circuit of a semiconductor device is designed. In step 2 (mask formation), a mask is formed on the basis of the designed circuit pattern. In step 3 (wafer formation), a wafer is formed using a material such as silicon. In step 4 (wafer process), called a pre-process, an actual circuit is formed on the wafer by lithography using the mask and wafer device using the exposure apparatus of the present invention. Step 5 (assembly), called a post-process, is the step of forming a semiconductor chip by using the wafer formed in step 4, and includes an assembly process (dicing and bonding) and packaging process (chip encapsulation). In step 6 (inspection), the semiconductor device manufactured in step 5 undergoes inspections such as an operation confirmation test and a durability test. After these steps, the semiconductor device is completed and shipped in step 7.

Figure 15:
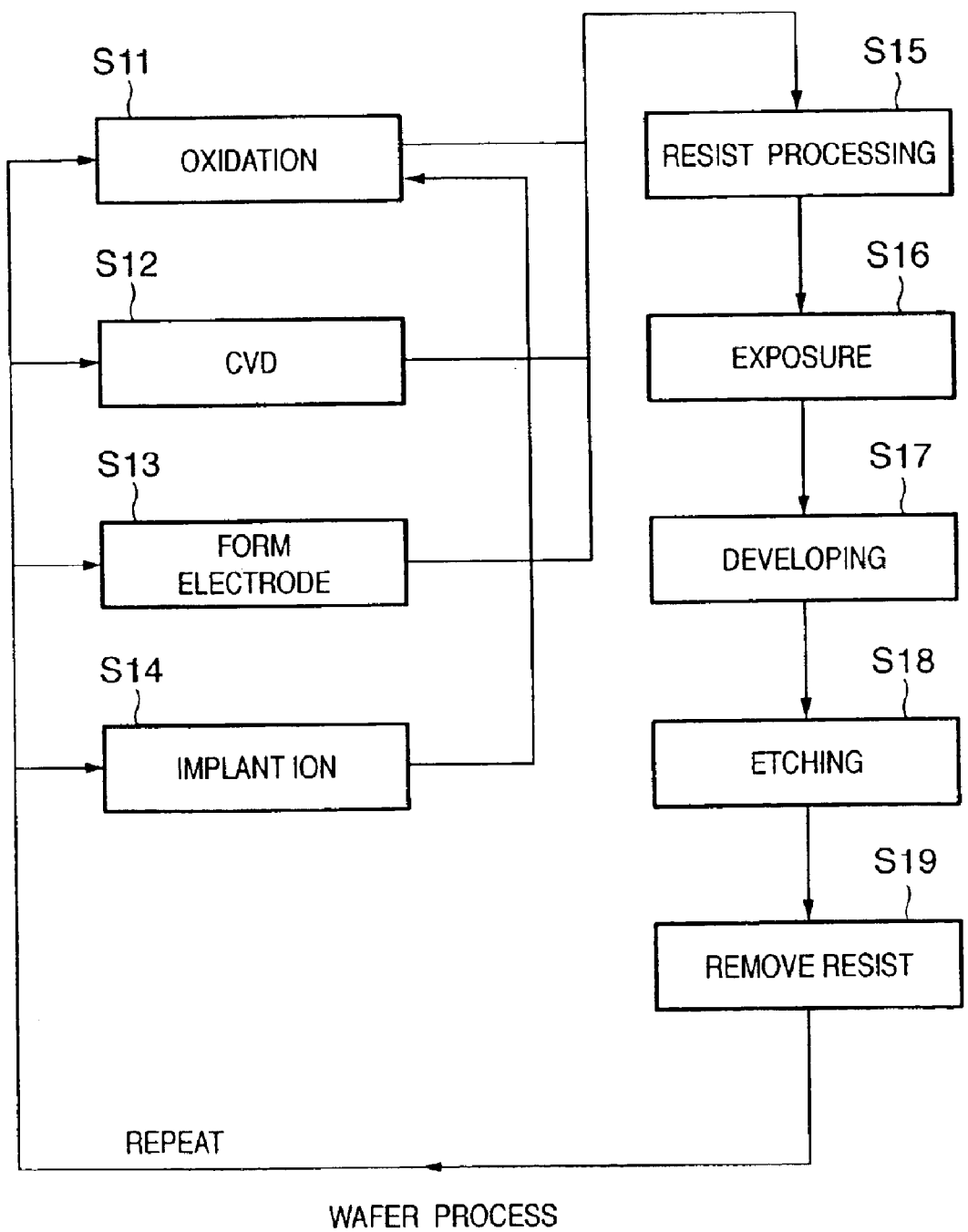
FIG. 15 is a flow chart showing the detailed flow of the wafer process using the exposure apparatus of the present invention.

FIG. 15 is a flow chart showing the detailed flow of the wafer process using the exposure apparatus of the present invention. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus transfers a circuit pattern onto the wafer. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer.

According to the present invention, for example, vibration transmission between two independently supported structures through a member for connecting the structures and forming an enclosed space can be suppressed. This can increase the exposure precision in an exposure apparatus.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus which has an optical system and transfers a pattern of a mask to a substrate via said optical system, said apparatus comprising:

a structure;

a partition wall which defines a space including an optical path of said optical system; and an elastic seal member which couples said structure and said partition wall to seal the space, wherein said elastic seal member is arranged so that a hollow cylinder is compressed in a direction of an axis of the hollow cylinder, the hollow cylinder in an uncompressed state being comprised of a member undulated in a cross section perpendicular to the axis and a shape of the uncompressed-state hollow cylinder in the cross section being substantially uniform along the axis.

2. An apparatus according to claim 1, wherein a form of said elastic seal member in the cross section has a plurality of protrusions.

3. An apparatus according to claim 1, wherein said elastic seal member is made of a material selected from the group consisting of resin and rubber.

4. An apparatus according to claim 1, wherein said elastic seal member is made of fluororubber.

5. An apparatus according to claim 1, wherein said elastic seal member has a thickness not greater than 2 mm.

6. An apparatus according to claim 1, wherein said elastic seal member is resistant to a gage pressure of 1 MPa.

7. An apparatus according to claim 1, wherein said elastic seal member is comprised of the undulated member arranged in a shape as the undulated member is arranged on side surfaces of a polygonal cylinder.

8. An apparatus according to claim 1, wherein said elastic seal member is comprised of the undulated member arranged in a shape as the undulated member is arranged on side surfaces of a circular cylinder.

9. An apparatus according to claim 1, wherein said structure is supported via a vibration isolating mechanism, and said partition wall is supported by a support member without a vibration isolating mechanism.

10. An apparatus according to claim 1, wherein said apparatus comprises a plurality of said structures, and a plurality of said elastic seal members corresponding to said plurality of said structures, respectively.

11. An apparatus according to claim 1, wherein said structure is supported by a support member without a vibration isolating mechanism, and said partition wall is supported via a vibration isolating mechanism.

12. An apparatus according to claim 1, further comprising a stage to hold one of the mask and the substrate, wherein said stage is arranged in the space.

13. A device manufacturing method comprising steps of:

transferring a pattern to a substrate using an exposure apparatus as defined in claim 1; and developing the substrate to which the pattern has been transferred.

* * * * *

UNITED STATES PATENT AND TRADEMARK OFFICE
CERTIFICATE OF CORRECTION

PATENT NO. : 6,914,663 B2
DATED : July 5, 2005
INVENTOR(S) : Hiromichi Hara

It is certified that error appears in the above-identified patent and that said Letters Patent is hereby corrected as shown below:

Title page,
Item [56], References Cited, OTHER PUBLICATIONS,
"Okabe" reference, "Publications," should read -- Publication, --.

Column 4,
Line 24, "invention;" should read -- invention; and --.

Column 9,
Line 64, "air-conditions" should read -- air-conditioned --.
Line 67, "eg.," should read -- e.g., --.

Column 10,
Line 11, "semiconductor." should read -- semiconductor device. --.

Column 12,
Line 15, "steps" should read -- the steps --.

Signed and Sealed this

Sixth Day of December, 2005

JON W. DUDAS
*Director of the United States Patent and Trademark Office*